(12) United States Patent
Hendrickson et al.

(10) Patent No.: US 8,059,468 B2
(45) Date of Patent: Nov. 15, 2011

(54) SWITCHED BITLINE VTH SENSING FOR NON-VOLATILE MEMORIES

(75) Inventors: Nicholas T. Hendrickson, Folsom, CA (US); Kerry D. Tedrow, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 734 days.

(21) Appl. No.: 11/799,967

(22) Filed: May 3, 2007

(65) Prior Publication Data
US 2008/0273397 A1 Nov. 6, 2008

(51) Int. Cl.
*G11C 16/28* (2006.01)
(52) U.S. Cl. ........... 365/185.21; 365/185.2; 365/185.25; 365/185.03

(58) Field of Classification Search ............. 365/185.21, 365/185.2, 185.25, 185.03
See application file for complete search history.

(56) References Cited

U.S. PATENT DOCUMENTS

| | | | | |
|---|---|---|---|---|
| 5,337,270 A | * | 8/1994 | Kawata et al. | 365/149 |
| 5,412,606 A | * | 5/1995 | Lee | 365/203 |
| 6,847,533 B2 | * | 1/2005 | Regev et al. | 365/49.15 |
| 6,882,561 B2 | * | 4/2005 | Kwon et al. | 365/149 |
| 7,590,017 B2 | * | 9/2009 | Romanovskyy et al. | 365/203 |

* cited by examiner

*Primary Examiner* — Andrew Q Tran
(74) *Attorney, Agent, or Firm* — Kacvinsky Daisak PLLC

(57) ABSTRACT

A transistor provides a voltage source commonly switched by SE and SO switches to pre-charge both the even bitline and the odd bitline. The SE and SO switches are open during a sensing stage to determine whether the cell side or the reference side has a higher current and determine the charge stored by a memory cell transistor.

10 Claims, 3 Drawing Sheets

SWITCHED BITLINE VTH SENSING FOR NON-VOLATILE MEMORIES

Technological developments permit digitization and compression of large amounts of voice, video, imaging, and data information, which may be transmitted from laptops and other digital equipment to other devices within the network. These developments in digital technology and enhancements to applications have stimulated a need for memory storage to handle the higher data volume supplied to these processing devices. Therefore, improved circuits and improved methods are needed to increase the efficiency of memory operations.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
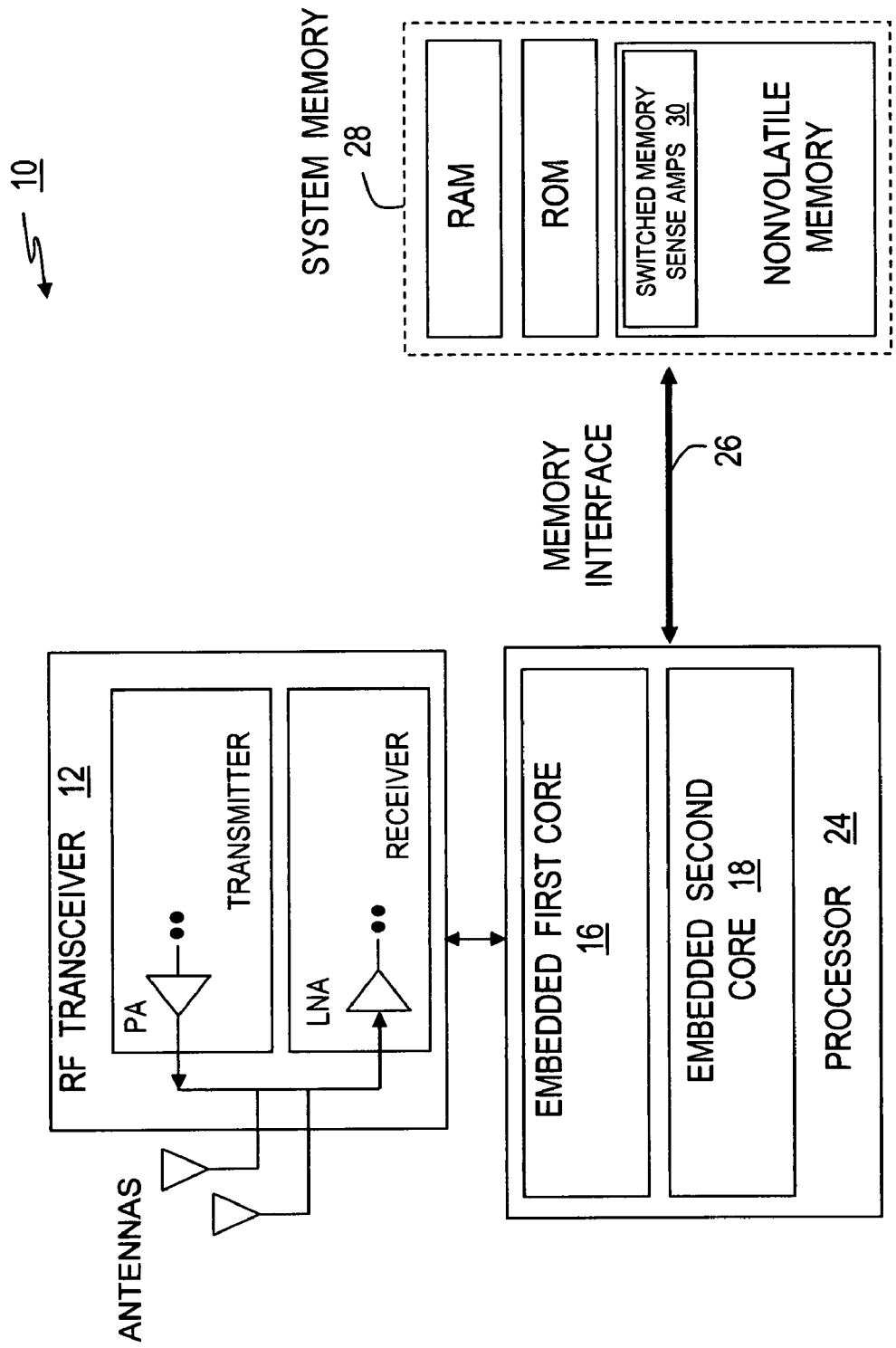
FIG. 1 is a diagram that illustrates a wireless device that may store data and executable code in non-volatile memory that includes switched memory sense amps in accordance with the present invention.

It will be appreciated that for simplicity and clarity of illustration, elements illustrated in the figures have not necessarily been drawn to scale. For example, the dimensions of some of the elements may be exaggerated relative to other elements for clarity. Further, where considered appropriate, reference numerals have been repeated among the figures to indicate corresponding or analogous elements.

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

Developments in a number of different digital technologies have greatly increased the need to store and transfer data from one device across a network to another system. Technological developments permit digitization and compression of large amounts of voice, video, imaging, and data information, which may be transmitted from laptops and other digital equipment to other devices within the network. The present invention may facilitate applications using higher resolution displays, better image capturing cameras, more storage capability, and new applications for mobile video. As such, the present invention may be used in a variety of products with the claimed subject matter incorporated into desktop computers, laptops, smart phones, MP3 players, USB drives, memory cards, cameras, communicators and Personal Digital Assistants (PDAs), medical or biotech equipment, automotive safety and protective equipment, automotive infotainment products, etc. However, it should be understood that the scope of the present invention is not limited to these examples.

FIG. 1 is a diagram that illustrates an embodiment that couples antenna(s) to a transceiver 12 to accommodate modulation/demodulation. Analog transceiver 12 is coupled with a processor 24 to process functions that fetch instructions, generate decodes, find operands, and perform appropriate actions, then stores results. The processor may include baseband and applications processing functions and utilize one or more processor cores 16 and 18 to handle application functions and allow processing workloads to be shared across the cores. The processor may transfer data through an interface 26 to memory storage in a system memory 28. The figure further illustrates a memory sensing circuit 30 that senses data stored in Non-Volatile Memories (NVM) in accordance with embodiments of the present invention.

Figure 2:
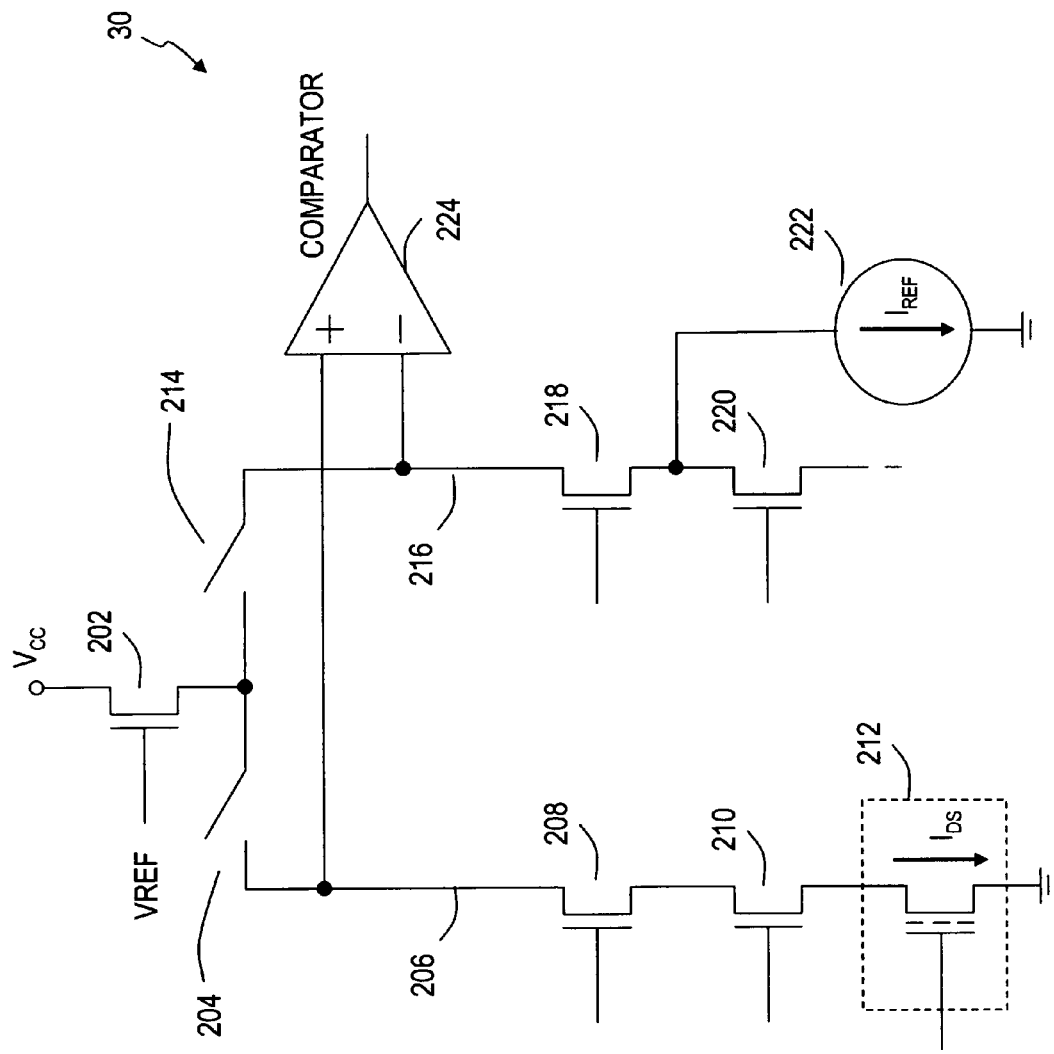
FIG. 2 is a schematic diagram that illustrates one embodiment of a memory sensing circuit for use with non-volatile memory.

FIG. 2 is a schematic diagram that illustrates an architecture for a memory sensing circuit 30 that may be used in a read operation to sense data stored in a non-volatile memory cell. Prior to reading the memory cell data value, a transistor 202 pre-charges both an even bitline 206 and an odd bitline 216. The even bitline 206 includes a GYE transistor 208, a LYE transistor 210 and an MCELL transistor 212. The odd bitline 216 includes a GYO transistor 218 and a LYO transistor 220. The memory cell, represented by MCELL transistor 212, may store either a single bit per cell (SBC) or multiple bits per cell in a multi-level cell (MLC) Flash technology.

To begin the pre-charge process, a SE switch 204 is closed to pre-charge the even bitline 206 and a SO switch 214 is closed to pre-charge the odd bitline 216. The charged delivered by transistor 202 to even bitline 206 and odd bitline 216 is controlled by the reference voltage VREF. The voltage pre-charge level is suitable for cell reliability in Flash technologies and further provides the appropriate bias voltage to operate the comparator 224.

Following the pre-charge of the even and odd bitlines, SE and SO switches 204 and 214 are opened to remove transistor 202 from affecting the bitlines and allow the even and odd bitlines to discharge. The even bitline 206, also referred to as the cell side, is discharged at a rate determined by the global bitline capacitance of even bitline 206 and the drain-to-source (IDS) current of MCELL transistor 212. The odd bitline 216, also referred to as the reference side, is discharged at a rate determined by the global bitline capacitance of odd bitline 216 and the reference current IREF of current source 222. After a pre-defined amplification time, comparator 224 latches and compares the voltage on even bitline 206 and odd bitline 216. Comparator 224 determines whether the cell side or the reference side has a higher current by sensing bitline voltage drops to determine the side having the greater voltage drop. Again, SE and SO switches 204 and 214 are opened during the time that comparator 224 senses the voltage drops in even bitline 206 and odd bitline 216 to determine the charge stored by MCELL transistor 212. Thus, even bitline 206 and odd bitline 216 are switched bitlines with VTH sensing for non-volatile memories.

MCELL transistor 212 may use an ETOXTM flash memory technology, although this is not a limitation of the present invention. MCELL transistor 212 has a an electrically isolated polysilicon floating gate capable of storing charge (electrons) that alter the behavior of the transistor depending on the amount of stored charge. When the memory cell is read by memory sensing circuit 30, the presence or absence of charge is determined by sensing the change in the behavior of the memory transistor due to the stored charge, and a change in the threshold voltage of the memory cell transistor may be interpreted as stored data values, i.e., stored "0" data bits and stored "1" data bits.

Figure 3:
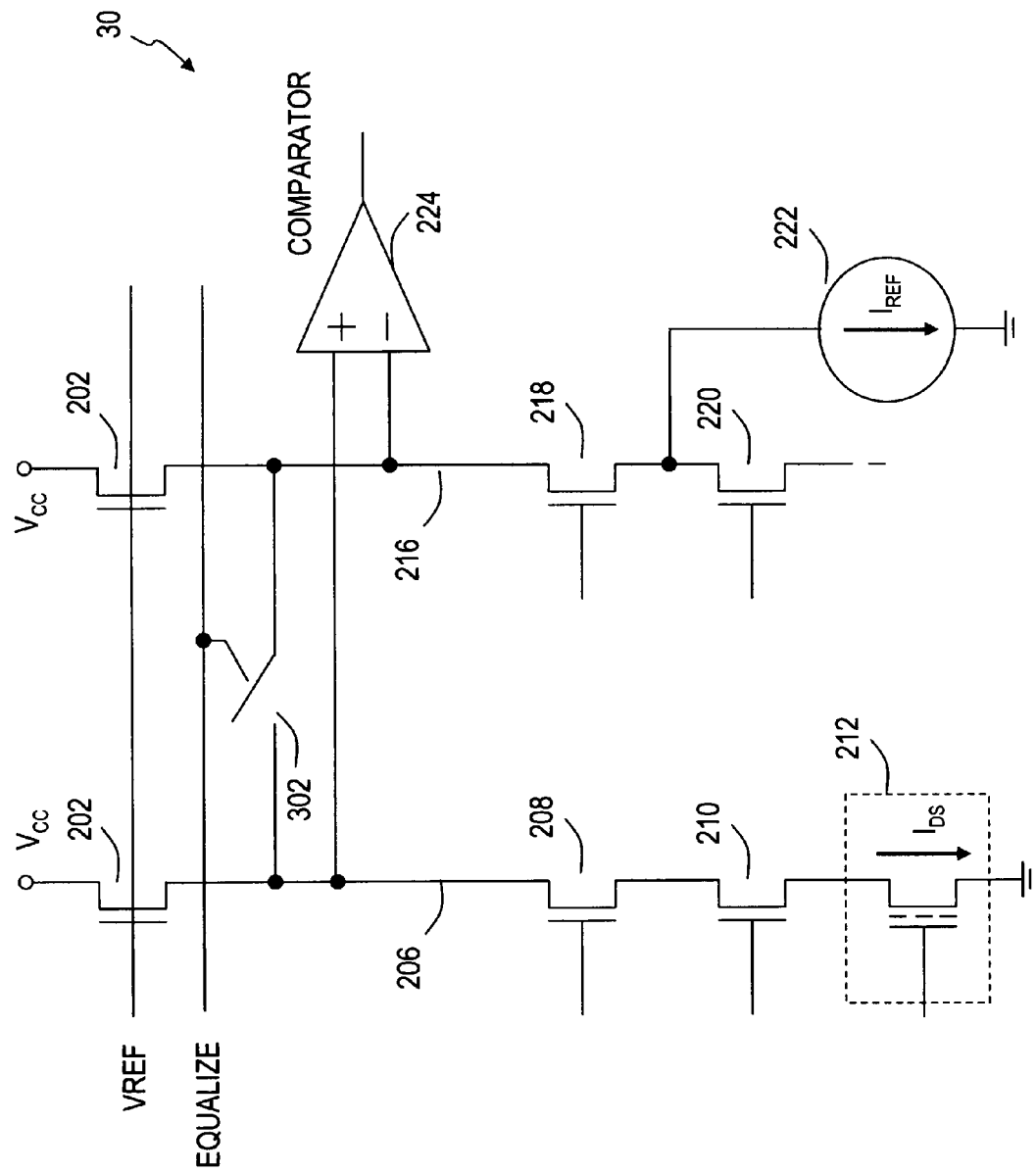
FIG. 3 is a schematic diagram that illustrates another embodiment of the memory sensing circuit for use with non-volatile memory.

As shown in FIG. 2, transistor 202 provides a voltage source commonly switched by SE and SO switches 204 and 214 respectively onto the even bitline 206 and the odd bitline 216. FIG. 3 shows an alternative embodiment where the bitlines may be completely separate and an equalizing switch 302 used to short the bitlines together. In this embodiment with completely separate even and odd bitlines, one transistor 202 provides a pre-charge voltage level to the even bitline 206 and another transistor 202 provides a pre-charge voltage level to the odd bitline 216. Whereas, prior art sense amps for non-volatile memories currently use matched cascode devices in the place of transistor(s) 202 and matched loads to provide sense points, the present invention described in the various embodiments includes fewer devices and by extension, fewer matched pairs to perform a sense operation.

By now it should be apparent that embodiments of the present invention allow future designs of MLC and SBC to include a lower VCC supply and reading using a switched pre-charge stage followed by a sensing stage. During the pre-charge stage, a common voltage source is switched by switches onto the even bitline and the odd bitline. During the sensing stage, a comparator having a latched sense amp compares the voltage on the even and odd bitlines to determine whether the cell side or the reference side has a higher current. The switches are closed during the pre-charge stage, but are open during the time that the comparator senses the voltage drops in the two bitlines in the sensing stage.

While certain features of the invention have been illustrated and described herein, many modifications, substitutions, changes, and equivalents will now occur to those skilled in the art. It is, therefore, to be understood that the appended claims are intended to cover all such modifications and changes as fall within the true spirit of the invention.

The invention claimed is:

1. A sensing structure for a non-volatile memory, comprising:
   first and second switches;
   a voltage source coupled to a common connection of the first and second switches to control a charge delivered to an even bitline and an odd bitline during a pre-charge stage; and
   a comparator coupled to the even bitline and the odd bitline, the comparator to compare a voltage on the even bitline with a voltage on the odd bitline to determine whether a memory cell connected to the even bitline or a reference current connected to the odd bitline has a higher current;
   wherein the memory cell comprises a non-volatile memory transistor having an electrically isolated polysilicon floating gate capable of storing charge that alter the behavior of the transistor depending on the amount of stored charge.

2. The sensing structure of claim 1 wherein the first and second switches are open during a time that the comparator senses voltage drops in the even bitline and the odd bitline in a sensing stage.

3. The sensing structure of claim 1 wherein the voltage source comprises a transistor having a drain coupled to a power conductor, a gate to receive a reference voltage potential and a source coupled to the common connection of the first and second switches.

4. A memory device, comprising:
   a voltage source to provide a pre-charge potential;
   first and second switches having a common connection coupled to the voltage source to receive the pre-charge potential, where the first switch supplies the pre-charge potential to an even bitline having a memory cell and the second switch supplies the pre-charge potential to an odd bitline having a reference current; and
   a comparator coupled to the even bitline and the odd bitline to compare a voltage that is altered from the pre-charge potential by the memory cell on the even bitline and a voltage that is altered from the pre-charge potential by the reference current on the odd bitline;
   wherein the memory cell comprises a non-volatile memory transistor having an electrically isolated polysilicon floating gate capable of storing charge that alter the behavior of the transistor depending on the amount of stored charge.

5. The memory device of claim 4 wherein the first and second switches are closed during a time that the pre-charge potential is transferred to the even bitline and the odd bitline and open during a time that the comparator senses voltage drops in the even bitline and the odd bitline.

6. The memory device of claim 4 wherein the voltage source is a transistor that receives a reference voltage on a gate to control the pre-charge potential supplied to the first and second switches.

7. The memory device of claim 4 wherein the memory cell stores a single bit per cell (SBC).

8. The memory device of claim 4 wherein the memory cell stores multiple bits per cell in a multi-level cell (MLC) Flash technology.

9. A method comprising:
   generating a pre-charge potential by a reference voltage on a gate of a transistor;
   closing first and second switches to transfer the pre-charge potential respectively to an even bitline and an odd bitline; and
   opening the first and second switches to allow a current conducted by a memory cell to alter a voltage on the even bitline from the pre-charge potential and a reference current conducted in the odd bitline to alter a voltage on the odd bitline from the pre-charge potential;
   wherein the memory cell comprises a non-volatile memory transistor having an electrically isolated polysilicon floating gate capable of storing charge that alter the behavior of the transistor depending on the amount of stored charge.

10. The method of claim 9, further comprising:
    comparing the voltage on the even bitline with the voltage on the odd bitline when the first and second switches are open to determine whether the current conducted by the memory cell connected to the even bitline or the reference current conducted in the odd bitline is a higher current.

* * * * *